United States Patent
Zhang et al.

(10) Patent No.: US 11,616,196 B2
(45) Date of Patent: Mar. 28, 2023

(54) LOW CURRENT RRAM-BASED CROSSBAR ARRAY CIRCUIT IMPLEMENTED WITH SWITCHING OXIDE ENGINEERING TECHNOLOGIES

(71) Applicant: TETRAMEM INC., Newark, CA (US)

(72) Inventors: Minxian Zhang, Newark, CA (US); Ning Ge, Newark, CA (US)

(73) Assignee: TetraMem Inc., Fremont, CA (US)

( * ) Notice: Subject to any disclaimer, the term of this patent is extended or adjusted under 35 U.S.C. 154(b) by 50 days.

(21) Appl. No.: 16/921,933

(22) Filed: Jul. 7, 2020

(65) Prior Publication Data
US 2022/0013720 A1    Jan. 13, 2022

(51) Int. Cl.
*H01L 45/00*        (2006.01)
*H01L 27/24*        (2006.01)

(52) U.S. Cl.
CPC ........ *H01L 45/146* (2013.01); *H01L 27/2463* (2013.01); *H01L 45/08* (2013.01); *H01L 45/1233* (2013.01); *H01L 45/1253* (2013.01)

(58) Field of Classification Search
CPC ... H01L 45/146; H01L 45/1233; H01L 45/08; H01L 45/1253; H01L 27/2463
See application file for complete search history.

(56) References Cited

U.S. PATENT DOCUMENTS

| | | | | |
|---|---|---|---|---|
| 2008/0121864 A1* | 5/2008 | Seo | ...................... | H01L 27/2436 257/4 |
| 2011/0248236 A1* | 10/2011 | Kim | ...................... | H01L 45/146 257/4 |
| 2013/0168632 A1* | 7/2013 | Moon | ................. | H01L 45/1246 977/773 |

(Continued)

OTHER PUBLICATIONS

Daniele Ielmini, Resistive switching memories based on metal oxides: mechanisms, reliability and scaling, Semicond. Sci. Technol. 31 (2016) 063002 (Year: 2016).*

(Continued)

*Primary Examiner* — Shih Tsun A Chou
(74) *Attorney, Agent, or Firm* — Jaffery Watson Mendonsa & Hamilton LLP

(57) ABSTRACT

Switching oxide engineering technologies relating to low current RRAM-based crossbar array circuits are disclosed. An apparatus, in some implementations, includes: a substrate; a bottom electrode formed on the substrate; a switching oxide stack formed on the bottom electrode. The switching oxide stack includes one or more base oxide layers and one or more discontinuous oxide layers alternately stacked; An apparatus further includes a top electrode formed on the switching oxide stack. The base oxide layer includes $TaO_x$, $HfO_x$, $TiO_x$, $ZrO_x$, or a combination thereof. The discontinuous oxide layer includes $Al_2O_3$, $SiO_2$, $Si_3N_4$, $Y_2O_3$, $Gd_2O_3$, $Sm_2O_3$, $CeO_2$, $Er_2O_3$, or the combination thereof.

16 Claims, 9 Drawing Sheets

(56) References Cited

U.S. PATENT DOCUMENTS

2014/0056056 A1* 2/2014 Takagi ............... G11C 13/004
 365/148
2021/0242399 A1* 8/2021 Lee ..................... H01L 45/1675

OTHER PUBLICATIONS

Baik et al., Electrical properties and thermal stability in stack structure of HfO2/Al2O3/InSb by atomic layer deposition, Sci Rep 7, 11337 (2017) (Year: 2017).*

* cited by examiner

| Set at Current Compliance, Ampere | Post Set Resistance at 0.2 V, Ohm |
|---|---|
| 10 µA | 142 k |
| 20 µA | 52 k |
| 40 µA | 27 k |
| 60 µA | 15 k |
| 80 µA | 11 k |
| 100 µA | 5.8 k |

FIG. 9

LOW CURRENT RRAM-BASED CROSSBAR ARRAY CIRCUIT IMPLEMENTED WITH SWITCHING OXIDE ENGINEERING TECHNOLOGIES

TECHNICAL FIELD

The present disclosure relates generally to crossbar array circuits with one or more Resistive Random-Access Memories (RRAMs) and more specifically to low current RRAM-based crossbar array circuits implemented with switching oxide engineering technologies.

BACKGROUND

Conventionally, a crossbar array circuit may include horizontal electrode rows and vertical electrode columns (or other electrodes) intersecting with each other, with crossbar devices formed at the intersecting points. The crossbar array may be used in non-volatile solid-state memory, signal processing, control systems, high-speed image processing, neural network, and other applications.

An RRAM is a two-terminal passive device that is capable of changing resistance upon sufficient electrical stimulations, which have attracted significant attention for high-performance nonvolatile memory applications. The resistance of the RRAM may be electrically switched between two states: a high-resistance state (HRS) and a low-resistance state (LRS). The switching event from HRS to LRS is called "Set" or "On" switching process. Conversely, the switching from LRS to HRS is called "Reset" or "Off" switching process.

RRAMs implemented in crossbar arrays may provide In-Memory Computing (IMC) capabilities due to their high retentions on resistance states and their high densities. To provide IMC architectures using RRAM-based crossbar array circuit, such capabilities as providing analog behaviors, a multi-states storage, ultra-low power consumption, and progressive voltage/current sweep are desired.

Providing these desirable technical features in low current RRAM-based crossbar array circuits thus remain technically challenging.

SUMMARY

Switching oxide engineering technologies relating to low current RRAM-based crossbar array circuits are disclosed.

An apparatus, in some implementations, includes: a substrate; a bottom electrode formed on the substrate; a switching oxide stack formed on the bottom electrode. The switching oxide stack includes one or more base oxide layers and one or more discontinuous oxide layers alternately stacked; An apparatus further includes a top electrode formed on the switching oxide stack. The base oxide layer includes $TaO_x$, $HfO_x$, $TiO_x$, $ZrO_x$, or a combination thereof. The oxide discontinuous layer includes $Al_2O_3$, $SiO_2$, $Si_3N_4$, $Y_2O_3$, $Gd_2O_3$, $Sm_2O_3$, $CeO_2$, $Er_2O_3$, or the combination thereof.

In some implementations, a thickness of the discontinuous oxide discontinuous layer is between 0.2 nm and 0.7 nm.

In some implementations, the base oxide layer comprises: $TaO_x$ doped with $HfO_x$, $TaO_x$ doped with $ZrO_x$, $HfO_x$ doped with $TaO_x$, or $HfO_x$ doped with $ZrO_x$.

In some implementations, the substrate comprises Si, $Si_3N_4$, $SiO_2$, $Al_2O_3$, or a combination thereof.

In some implementations, the switching oxide stack is formed by using Atomic Layer Deposition (ALD) technologies or co-sputter deposition technologies.

In some implementations, the switching oxide stack is formed by using ALD technologies, a sub-cycle comprising N1 cycles of the discontinuous oxide layer followed by N2 cycles of the base oxide layer, and the sub-cycle is repeated N3 times, where for instance N1=1, N2=4, and N3=7.

In some implementations, the switching oxide stack is formed by using ALD technologies, a sub-cycle comprising N1 cycles of the discontinuous oxide layer followed by N2 cycles of the base oxide layer, and the sub-cycle is repeated N3 times, where N2 is higher than N1.

In some implementations, the switching oxide stack is formed by using co-sputter deposition technologies, and individual RF powers are applied simultaneously to a first target made by the material of the base oxide and a second target made by the material of the discontinuous oxide.

The apparatus as claimed in claim 1, wherein the bottom electrode comprises Ag, Al, Au, Cu, Fe, W, Co, Ru, Ir, Rh, Ni, Mo, Pt, Pd, Ti, TiN, TaN, W, Zr, a combination thereof, or an alloy or any of these materials with any other electrically conductive materials.

In some implementations, the bottom electrode comprises a non-reactive material that is selected from: Pt, Pd, W, Co, Ru, Ir, Rh, TiN, TaN, a combination thereof, or an alloy or any of these materials with any other electrically conductive materials.

In some implementations, the top electrode comprises Ag, Al, Au, Cu, Fe, W, Co, Ru, Ir, Rh, Ni, Mo, Pt, Pd, Ti, TiN, TaN, W, Zr, a combination thereof, or an alloy or any of these materials with any other electrically conductive materials.

In some implementations, the top electrode comprises a reactive material that is selected from Ta, Hf, Zr, Ti, Al, Fe a combination thereof, or an alloy or any of these materials with any other electrically conductive materials, and a switching filament is configured to be formed within the switching oxide stack from the top electrode.

The apparatus, in some implementations, further includes: a column wire connected to the bottom electrode; and a row wire connected to the top electrode.

BRIEF DESCRIPTION OF THE DRAWINGS

FIG. 9 is a block diagram illustrating current compliance in view of resistance.

The implementations disclosed herein are illustrated by way of example, and not by way of limitation, in the figures of the accompanying drawings. Like reference numerals refer to corresponding parts throughout the drawings.

DETAILED DESCRIPTION

Switching oxide engineering technologies relating to low current RRAM-based crossbar array circuits are disclosed. The technologies described in the present disclosure may provide the following technical advantages.

First, the disclosed technologies increase the resistance of a low current RRAM in both the LRS and the HRS. The disclosed technologies use a discontinuous oxide layer or discontinuous oxide layers with higher bond energies and resistivities than those of the base oxides. The pinholes of the discontinuous layer effectively confine the conduction channels of the base oxides into very small regions and thus increase the resistance of the stack. The increased resistance decreases the Set/Reset current and thus increases the overall power efficiency, a desirable feature for IMC applications.

Second, the disclosed technologies mix base oxide with discontinuous oxide to form a ternary oxide or quaternary oxide or oxynitride. These material engineering techniques enable a RRAM device to provide such desirable characteristics as analog behaviors, multi-states data storage, and progressive voltage/current sweep, all of which are desirable in IMC applications.

Third, the disclosed technologies may reduce the Set/Reset energy and improve the data retention of the RRAM using a mixture of two base oxides.

Figure 1:
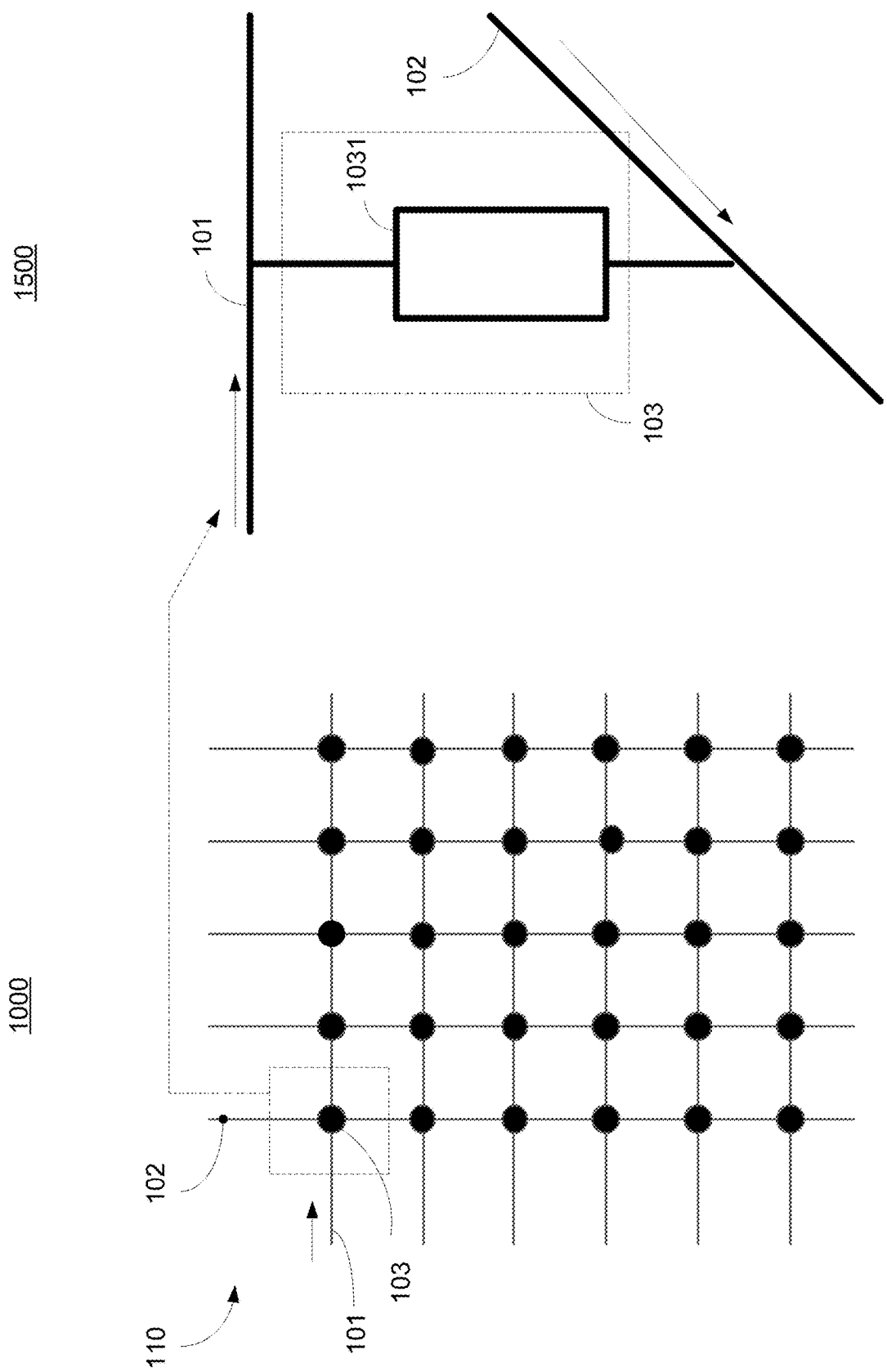
FIG. 1A is a block diagram illustrating an example crossbar array circuit in accordance with some implementations of the present disclosure.
FIG. 1B is a block diagram illustrating a partially enlarged view of example crossbar device in accordance with some implementations of the present disclosure.

FIG. 1A is a block diagram 1000 illustrating an example crossbar array circuit 110 in accordance with some implementations of the present disclosure. As shown in FIG. 1A, the crossbar array circuit 110 includes a first row wire 101, a first column wire 102, and a crossbar device 103.

FIG. 1B is a block diagram 1500 illustrating a partially enlarged view of the crossbar device 103 in accordance with some implementations of the present disclosure. In FIG. 1B, the crossbar device 103 is connected to the first row wire 101 and to the first column wire 102. In some implementations, the crossbar device 103 includes an RRAM cell 1031. The RRAM cell 1031 may be connected to a transistor in a one-Transistor-one-memristor (1T1R) stack, or connected to a selector in one-Selector-one-memristor (1S1R) stack, or a single memristor (1R) stack.

Figure 2:
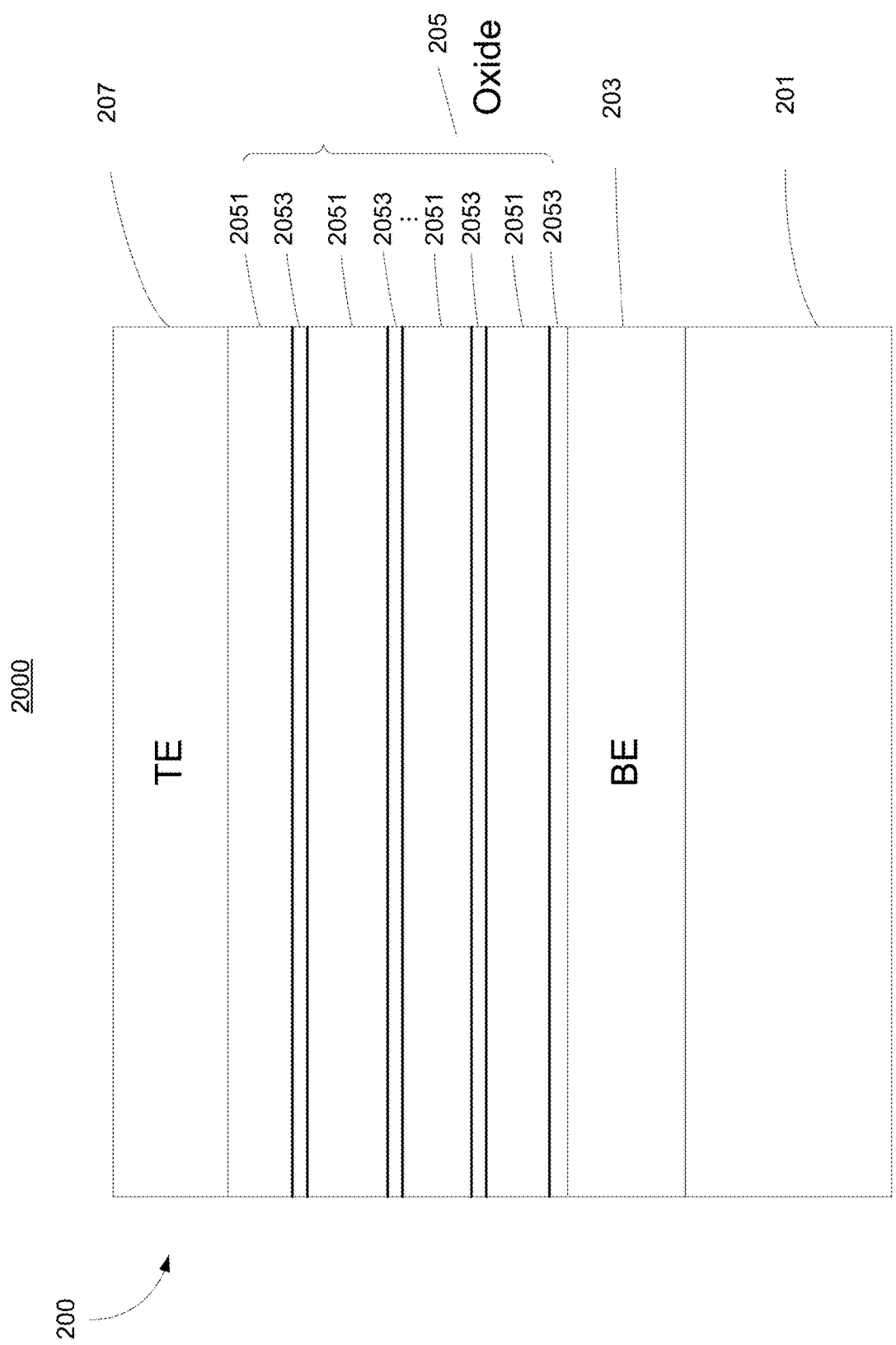
FIG. 2 is a block diagram illustrating an example RRAM cell in accordance with some implementations of the present disclosure.

FIG. 2 is a block diagram 2000 illustrating an RRAM cell 200 in accordance with some implementations of the present disclosure.

As shown in FIG. 2, the RRAM cell 200 includes a substrate 201, a bottom electrode 203 formed on the substrate 201, a switching oxide stack 205 formed on the bottom electrode 203, and a top electrode 207 formed on the switching oxide stack 205.

In some implementations, the substrate 201 is made of Si, $Si_3N_4$, $SiO_2$, $Al_2O_3$, or a combination thereof. In some implementations, the bottom electrode 203 is made of Ag, Al, Au, Cu, Fe, W, Co, Ru, Ir, Rh, Ni, Mo, Pt, Pd, Ti, TiN, TaN, W, Zr, a combination thereof, or an alloy of any of these materials with any other electrically conductive materials. In some implementations, the top electrode 207 includes Ag, Al, Au, Cu, Fe, Ni, Mo, Pt, Pd, Ti, TiN, TaN, W, Zr, a combination thereof, or an alloy of any of these materials with any other electrically conductive materials.

In some implementations, the switching oxide stack 205 functions as a filament forming stack, within which one or more filaments may form. In some implementations, the top electrode 207 is made of a reactive material including one of: Ta, Hf, Zr, Ti, Al, Fe a combination thereof, or an alloy of any of these materials with any other electrically conductive materials; the bottom electrode 203 is made of a non-reactive material including one of: Pt, Pd, Ir, W, Co, Ru, Rh, TiN, TaN, a combination thereof, or an alloy of any of these materials with any other electrically conductive materials. Under appropriate thermodynamic and kinetic conditions, metal from a reactive electrode may form a switching filament within the switching oxide stack 205.

In some implementations, a reactive material has a higher oxygen solubility and mobility than those of a switching oxide and a filament. A reactive material may create oxygen vacancies in a switching oxide and form a filament solid solution containing oxygen. A reactive material may include one of: Ta, Hf, Ti, Zr, Al, Fe a combination thereof, or an alloy of any of Ta, Hf, Ti, Al, Fe and Zr with any other electrically conductive materials.

In some implementations, a non-reactive material has a higher chemical stability than those of a switching oxide and a filament. A non-reactive material may include noble metal material such as: Pt, Pd, Ir, a combination thereof, or an alloy of any of Pt, Pd, Ir, with any other electrically conductive materials. A non-reactive material may also include metal nitride material such as: TiN, TaN, a combination thereof, or an alloy of any of TiN and TaN with any other electrically conductive materials.

As shown in FIGS. 1A-1B, in some implementations, a bottom electrode may be a column wire or may be connected to a column wire; a top electrode may be a row wire or may be connected to the row wire.

In some implementations, the switching oxide stack 205 may be made of $TaO_x$, $HfO_x$, $TiO_x$, $ZrO_x$, or a combination thereof. The switching oxide stack 205, in some implementations, is a filament forming stack. For example, when a Set signal (e.g. a Set voltage) is applied, a conductive filament may form within the switching oxide stack 205. The switching oxide stack 205 may include one or more of base oxides 2051 and one or more of discontinuous oxides 2053 alternately stacked.

In some implementations, the base oxide layer 2051 may be made of $TaO_x$, $HfO_x$, $TiO_x$, $ZrO_x$, or a combination thereof.

Furthermore, to reduce the set/reset energy and improve data retention of an RRAM, it is desirable to that a switching oxide stack is implemented using different base oxides mixtures.

For instance, $HfO_x$ may be more stable than $TaO_x$, because the bonding energy of Hf—O bond is stronger than that of a Ta—O bond. For another instance, because the activation energy of oxygen diffusion in $TaO_x$ is higher than that in $HfO_x$, $TaO_x$ provides better data retention capability than $HfO_x$. Therefore, the base oxide 2051 may made of $TaO_x$ doped with $HfO_x$, $TaO_x$ doped with $ZrO_x$, $HfO_x$ doped with $TaO_x$, or $HfO_x$ doped with $ZrO_x$. By mixing two different base oxide materials, the Set/Reset energy may be reduced, and the data retention of an RRAM may be improved.

In some implementations, the discontinuous oxide 2053 is made of $Al_2O_3$, $SiO_2$, $Si_3N_4$, $Y_2O_3$, $Gd_2O_3$, $Sm_2O_3$, $CeO_2$, $Er_2O_3$, or a combination thereof. In some implementations, a discontinuous oxide is made of one or more materials that are more stable than those of which a base oxide is made.

In some implementations, the discontinuous oxide 2053 is $Al_2O_3$, and the base oxide 2051 is $HfO_x$. The Atomic Layer Deposition (ALD) technologies may be used to deposit the switching oxide stack 205. For example, a sub-cycle of N1 cycles $Al_2O_3$(N1=1) followed by N2 cycles $HfO_x$ (N2=4) is deposited, and the sub-cycle is repeated N3 times (N3=7). The number of cycles N1, N2, N3 may be optimized to improve results. In some implementations, the cycle of base oxide N2 is higher than the cycle of discontinuous oxide N1. As such, the base oxide 2051 is thicker than the discontinuous oxide 2053. These technologies enable a switching oxide stack to maintain its filament forming capabilities, with increased resistance.

In some implementations, a co-sputter deposition process combined with sequential sputter deposition process is used to form the new low current RRAM. The base oxide is formed with a co-sputter deposition process in which multiple RF powers are applied simultaneously to multiple oxide targets (e.g., $HfO_x$ and $TaO_x$ targets) to form a complete mixture of oxides. Sequential sputter deposition is followed where one or more discontinuous oxide layers (e.g., $Al_2O_3$) are added as distinct layers with the mixture based oxide layer. The co-sputter deposition of the base oxide and sequential sputter deposition of the discontinuous oxide can be repeated multiple times for the optimal results. The volume ratio of the base oxide to the discontinuous oxide in switching oxide 205 can be controlled by the co-sputter deposition parameters and the sequential sputter deposition parameters, respectively. Further, the base oxide and the discontinuous oxide are alternately deposited, because the discontinuous oxide should be formed as a discontinuous layer (in which pin-holes may be randomly distributed in terms of their numbers, sizes, and positions) above the base oxide. A discontinuous layer may increase the resistance of an RRAM cell during both the LRS and the HRS, a desirable feature for such low current operations as IMC applications.

Figure 3:
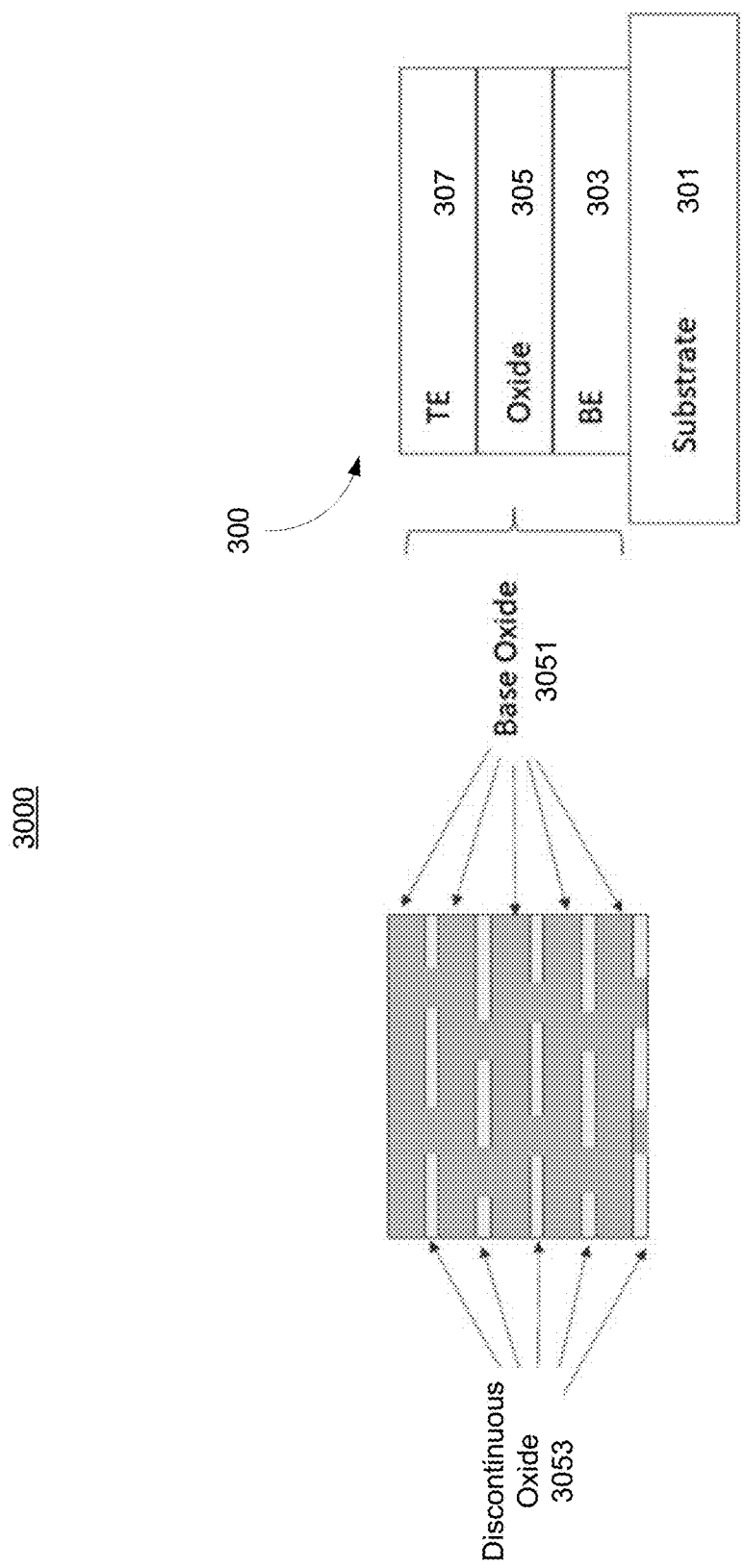
FIG. 3 is a block diagram illustrating a second example RRAM cell in accordance with some implementations of the present disclosure.

FIG. 3 shows a block diagram 3000 illustrating an RRAM cell 300 in accordance with some implementations of the present disclosure. The RRAM cell 300 may be formed using ALD technologies.

As shown in FIG. 3, the RRAM cell 300 includes a substrate 301, a bottom electrode 303 formed on the substrate 301, a switching oxide stack 305 formed on the bottom electrode 303, and a top electrode 307 formed on the switching oxide stack 305. The switching oxide stack 305 includes a base oxide 3051 and a discontinuous oxide 3053. As shown in a cross-sectional view of the switching oxide stack 305, discontinuous oxide layers 3053 are alternately stacked on base oxide layers 3051. Because each of the discontinuous layers or the base oxide layers is made with a predefined thinness, the switching oxide stack may include one or more discontinuous oxide islands 3053, which are randomly located within the entire base oxide layer 3051 (or the entire switching oxide stack 305).

In some implementations, since the discontinuous oxide 3053 is deposited for less than ten cycles per repeat cycle, the discontinuous oxide 3053 has a thickness between 0.2 nm and 0.7 nm. When the discontinuous oxide 3053 is between 0.2 nm and 0.7 nm thickness, the grain size or the cluster of the discontinuous oxide 3053 is insufficient to form a continuous layer; rather, disconnected islands regions may randomly from above or within the base oxide 3053, which increases the resistance of the RRAM cell 300 at both its LRS and its HRS. The increased resistance, in turn, decreases the Set/Reset current and thus increases an RRAM device's power efficiency.

Figure 4:
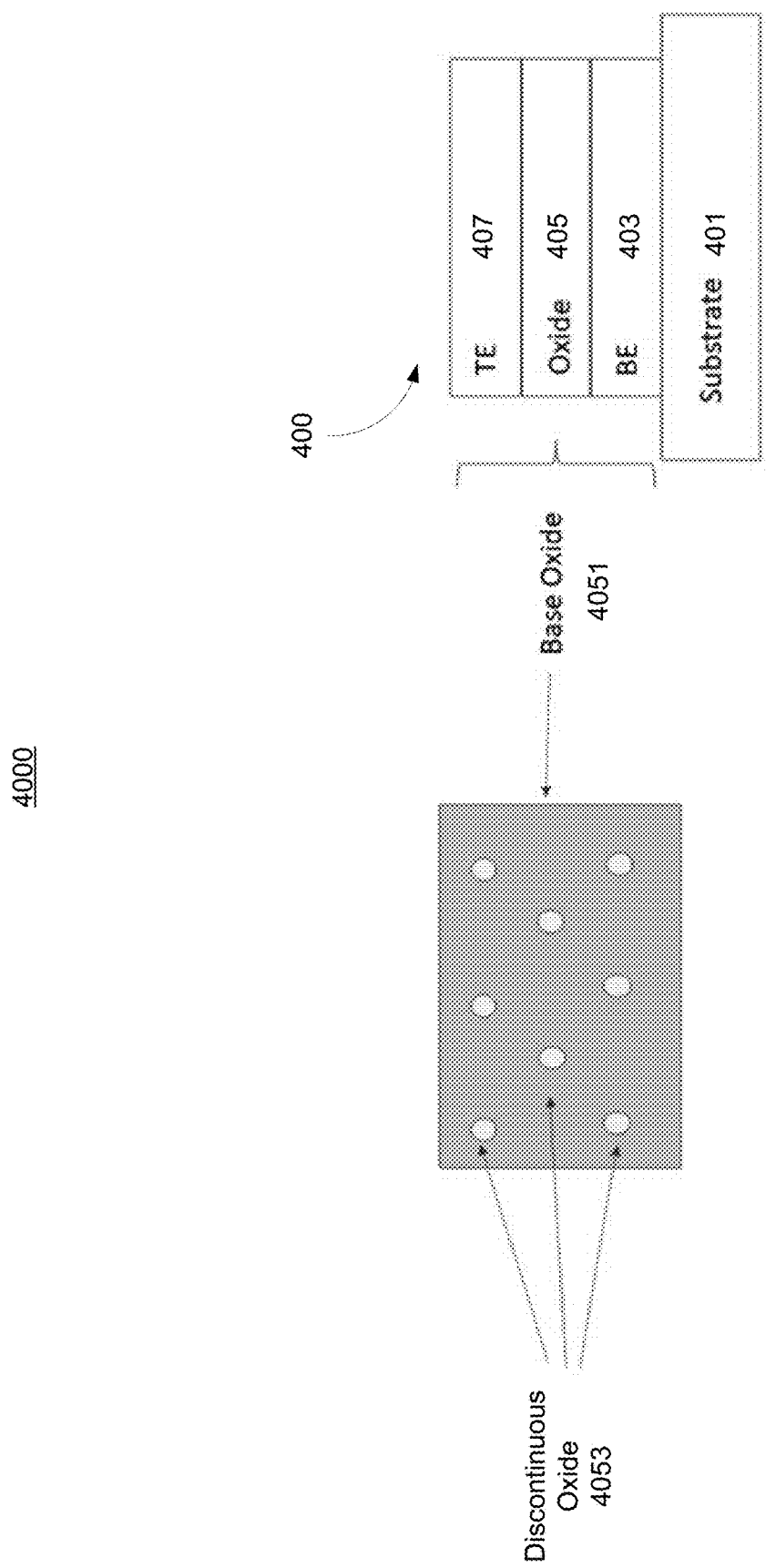
FIG. 4 is a block diagram illustrating a third example RRAM cell in accordance with some implementations of the present disclosure.

FIG. 4 is a block diagram 4000 illustrating an RRAM cell 400 in accordance with some implementations of the present disclosure. The RRAM cell 400 may be formed using co-sputter deposition and sequential sputter deposition technologies.

As shown in FIG. 4, the RRAM cell 400 includes a substrate 401, a bottom electrode 403 formed on the substrate 401, a switching oxide stack 405 formed on the bottom electrode 403, and a top electrode 407 formed on the switching oxide stack 405. The switching oxide stack 405 includes multiple layers of base oxide 4051 and discontinuous oxide 4053. As shown by the cross-sectional view of the switching oxide stack 405, the discontinuous oxide 4053 includes islands or pinholes formed within base oxides 4051. The distribution of the discontinuous oxide in base oxide and the ratio of the base oxide to the discontinuous oxide in switching oxide 205 can be controlled by the co-sputter deposition parameters for the base oxide and the sequential deposition parameters for the discontinuous oxide, respectively. Because the grain size or the cluster of the discontinuous oxide is not thick enough to form a continuous layer, the discontinuous oxides are formed at random-locations within the base oxide. The discontinuous oxides may also have a droplet-like shape in a cross-sectional view. While different from those formed by using the ALD technologies, the co-sputter deposition of the base oxide and the sequential sputter deposition of the discontinuous oxide may form a uniform oxide mixture close to the molecular scale. In these ways, the resistance of the RRAM cell 400 may be increased during both its LRS and its HRS. The increased resistant may, in turn, decrease the Set/Reset current and reduce operation power consumption, all of which are desirable features for IMC applications.

Figure 5:
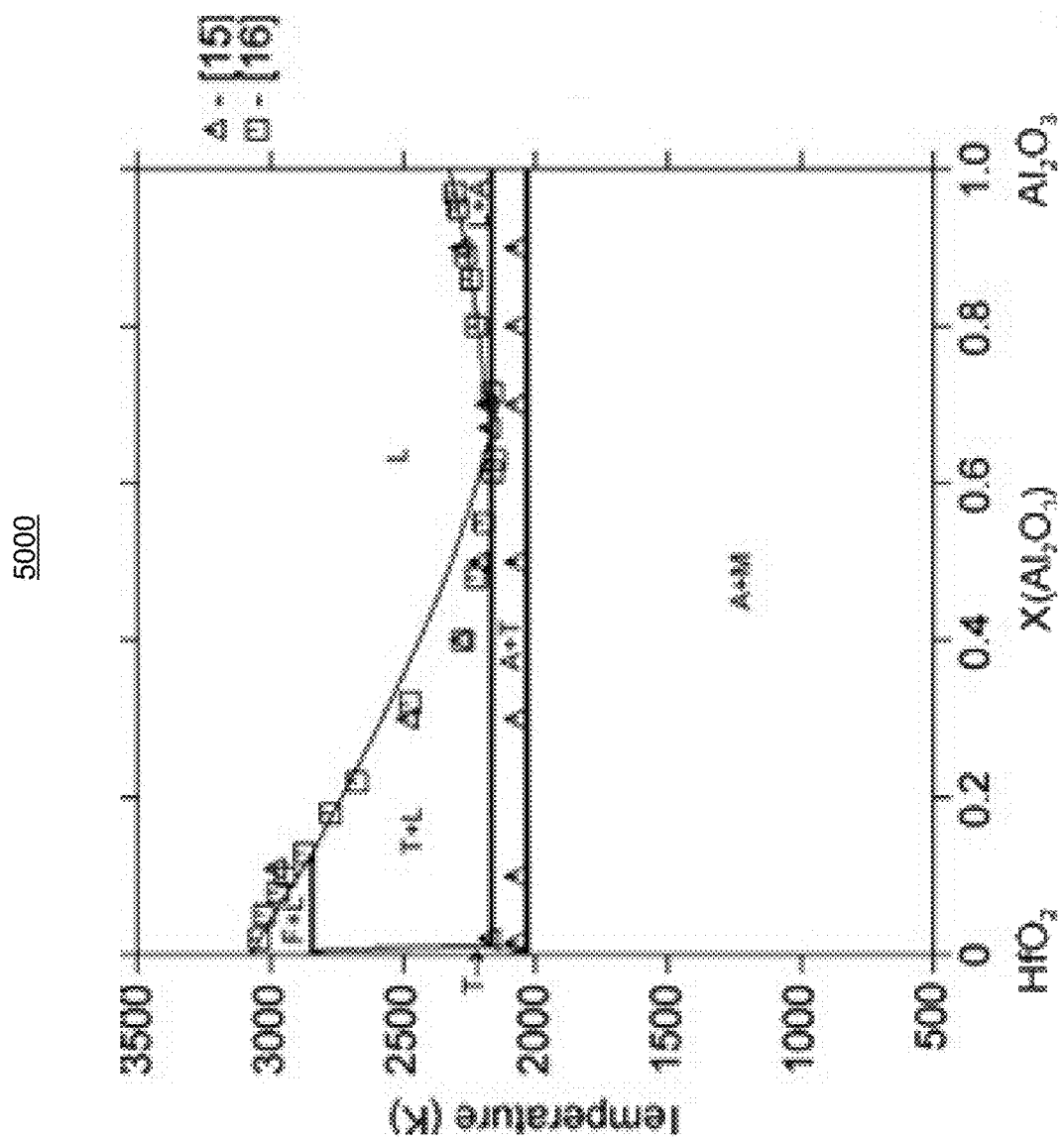
FIG. 5 is a phase equilibrium diagram illustrating the $HfO_2$—$Al_2O_3$ pseudo-binary showed phase equilibrium between $HfO_2$, and $Al_2O_3$.

FIG. 5 is a phase equilibrium diagram illustrating the $HfO_2$—$Al_2O_3$ pseudo-binary showed phase equilibrium between $HfO_2$, and $Al_2O_3$. As discussed above, to obtain discontinuous layers or distributed pin-holes of discontinuous oxide on the base oxide, the discontinuous oxide formed on the base oxide may not generate a ternary compound and do not form continuous solid solution with each other, which can make the phase status unpredictable. As shown in FIG. 5, no ternary oxide between $HfO_2$—$Al_2O_3$ is detected.

Figure 6:
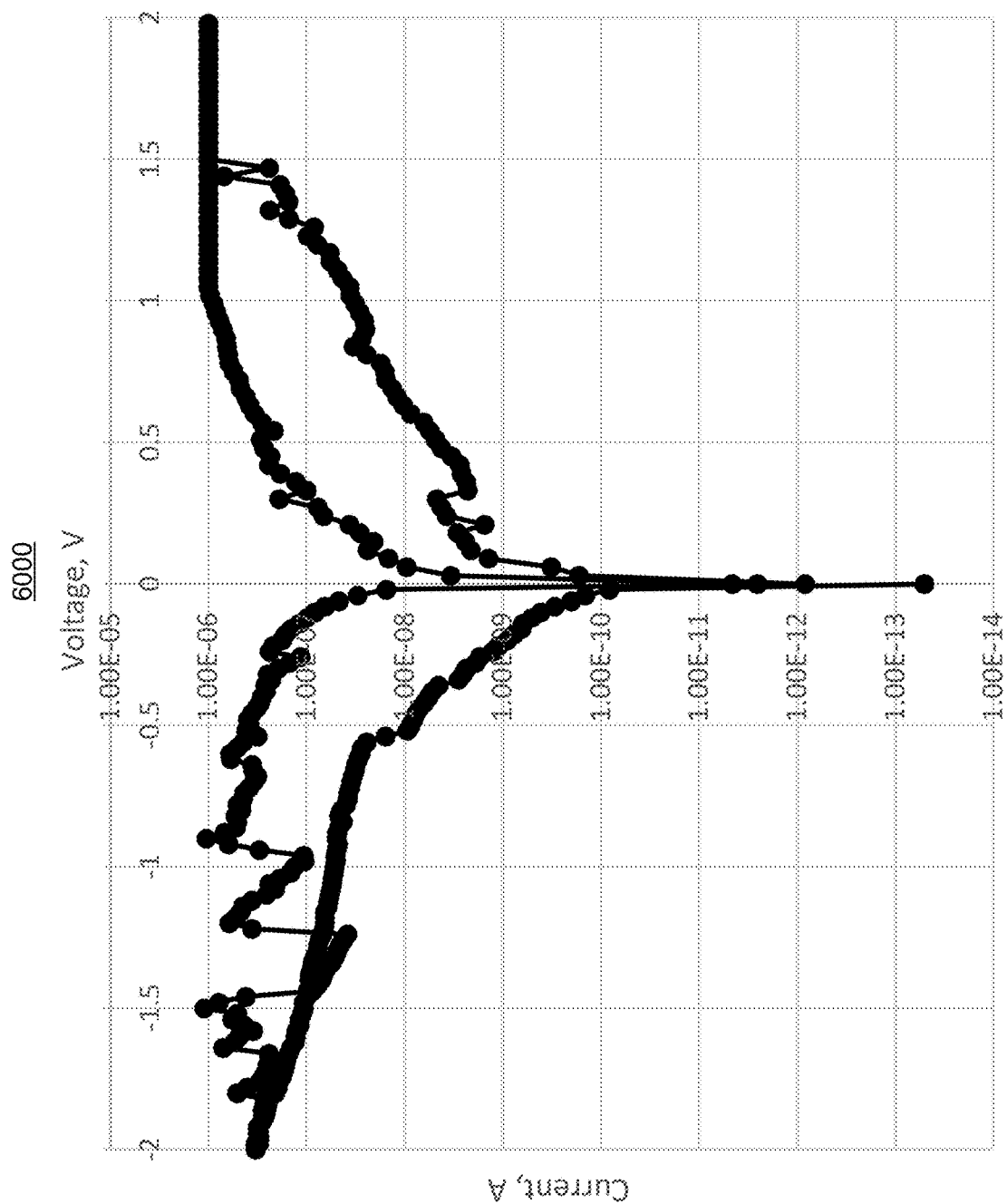
FIG. 6 is an IV curve chart illustrating example characteristic of an RRAM cell in accordance with some implementations of the present disclosure.

FIG. 6 is an IV curve chart 6000 illustrating example characteristic of an memristor cell in accordance with some implementations of the present disclosure. As shown in FIG. 6, during a low current switching process, when the reset current is around 1 µA, the On/Off ratio is greater than 10. For instance, when a post set resistance at 0.2 V is around 5.3 MΩ, and a post reset resistance at −0.2 V is around 220 MΩ.

Figure 7B:
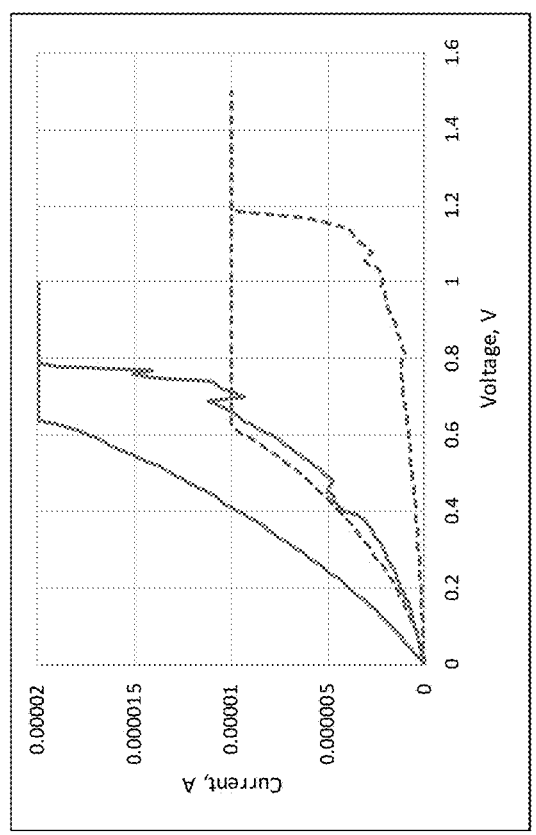
FIG. 7B is an IV curve chart, an enlarged vertical scale chart of FIG. 7A, illustrating example characteristic of an RRAM cell using current compliance from 10 μA to 20 μA.
Figure 7A:
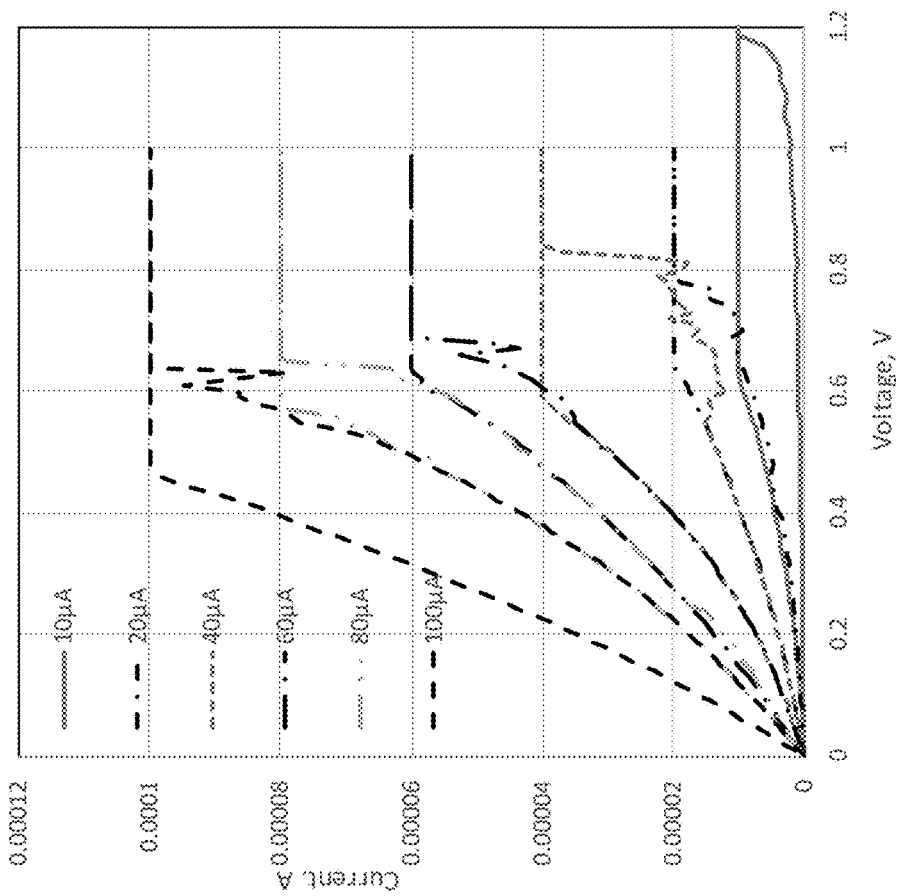
FIG. 7A is an IV curve chart illustrating example characteristic of an RRAM cell using current compliance from 10 μA to 100 μA in accordance with some implementations of the present disclosure.

FIG. 7A is an IV curve chart 7000 illustrating example characteristic of an RRAM cell using current compliance from 10 µA to 100 µA in accordance with some implementations of the present disclosure. FIG. 7A shows that the RRAM cell is capable of provide these features: analog behaviors, multi-states storage, ultra-low power consumption, and progressive voltage/current sweep capability, all of which are desirable for IMC applications.

FIG. 7B is an IV curve chart 7200, an enlarged vertical scale chart of FIG. 7A, illustrating the characteristic of the RRAM cell using current compliance from 10 µA to 20 µA.

FIG. 7A shows that the device resistance states are stable when read voltage is less than 0.2 V.

Figure 8:
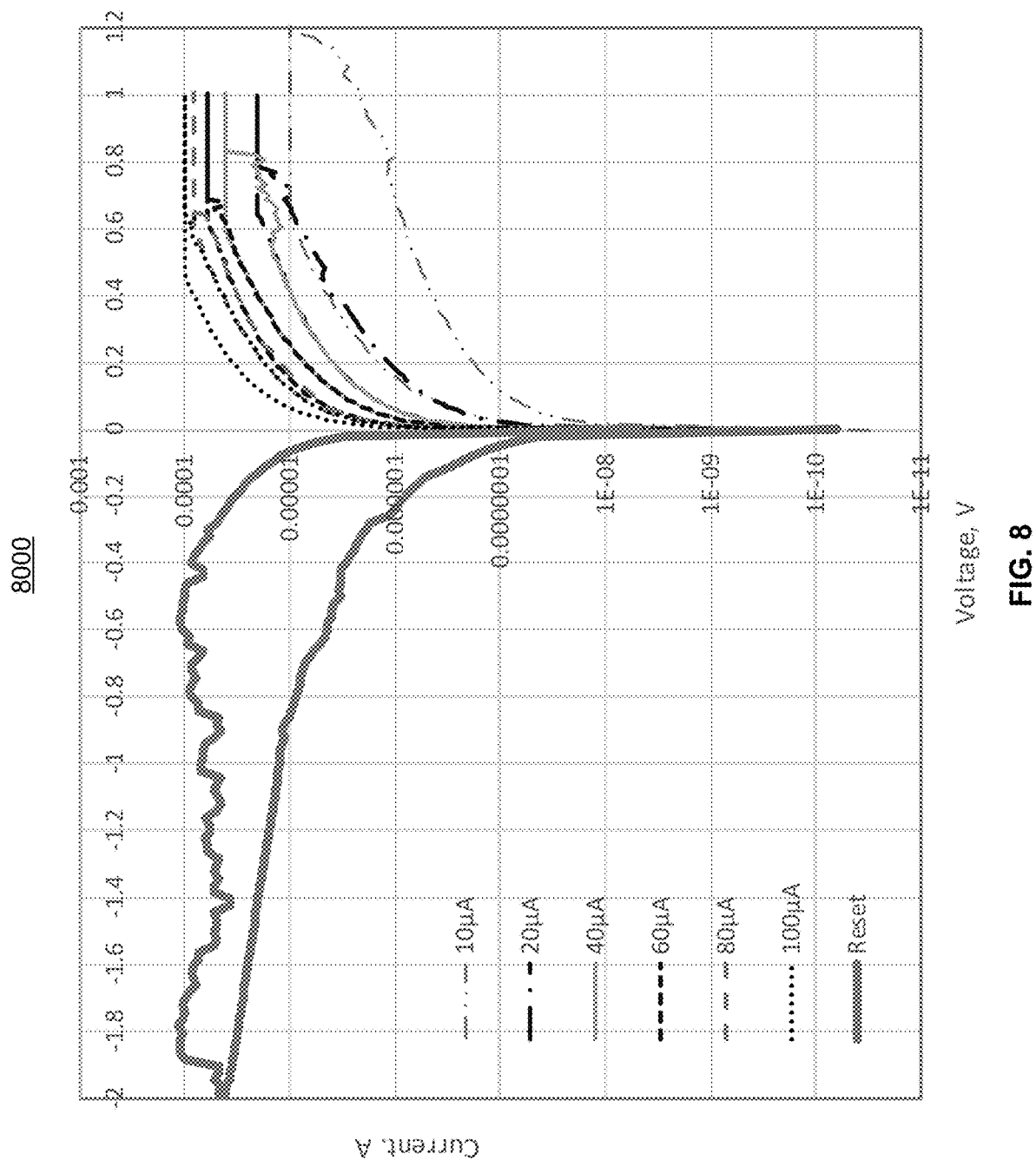
FIG. 8 is an IV curve chart illustrating the same data shown as FIGS. 7A-7B while demonstrating current levels in a log scale.

FIG. 8 is an IV curve chart illustrating the same data shown as FIGS. 7A-7B while demonstrating current levels in a logarithmic scale.

As shown in FIG. 8, after a Set current with 100 µA is applied, the Reset current is around 100 µA, which is a desirable behavior for low current operation FIG. 9 is a block diagram illustrating a current compliance versus resistance data diagram, with the post set resistance read at 0.2 V. Through the current compliance scale, the analog behavior can be observed from a high LRS of over 100 kΩ.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus comprising:
a substrate;
a bottom electrode formed on the substrate;
a switching oxide stack formed on the bottom electrode, wherein the switching oxide stack comprises a plurality of base oxide layers and a plurality of discontinuous oxide layers alternately stacked; and
a top electrode formed on the switching oxide stack, wherein the base oxide layers comprise one or more base oxides, wherein the one or more base oxides comprise at least one of $TaO_x$, $HfO_x$, $TiO_x$, or $ZrO_x$, wherein the plurality of discontinuous oxide layers comprises discontinuous oxide islands that are randomly located within the plurality of base oxide layers, and wherein the discontinuous oxide islands comprise at least one of $Al_2O_3$, $SiO_2$, $Si_3N_4$, $Y_2O_3$, $Gd_2O_3$, $Sm_2O_3$, $CeO_2$, or $Er_2O_3$.

2. The apparatus as claimed in claim 1, wherein a thickness of each of the discontinuous oxide layers is between 0.2 nm to 0.7 nm.

3. The apparatus as claimed in claim 1, wherein the one or more base oxides comprise: $TaO_x$ doped with $HfO_x$, $TaO_x$ doped with $ZrO_x$, $HfO_x$ doped with $TaO_x$, or $HfO_x$ doped with $ZrO_x$.

4. The apparatus as claimed in claim 1, wherein the substrate comprises Si, $Si_3N_4$, $SiO_2$, $Al_2O_3$, or a combination thereof.

5. The apparatus as claimed in claim 1, wherein the switching oxide stack is formed by using ALD technologies or co-sputter deposition combined with sequential sputter deposition technologies.

6. The apparatus as claimed in claim 5, wherein when the switching oxide stack is formed by using ALD technologies, a sub-cycle comprising N1 cycles of each of the discontinuous oxide layers followed by N2 cycles of one of the base oxide layers, and the sub-cycle is repeated N3 times, where N1=1, N2=4, and N3=7.

7. The apparatus as claimed in claim 5, wherein when the switching oxide stack is formed by using ALD technologies, a sub-cycle comprising N1 cycles of each of the discontinuous oxide layers followed by N2 cycles of one of the base oxide layers, and the sub-cycle is repeated N3 times, where N2 is higher than N1.

8. The apparatus as claimed in claim 5, wherein the base oxide layers comprise a mixture of multiple oxides formed by co-sputter deposition technologies, and wherein the discontinuous oxide layers are formed by sequential sputter depositions.

9. The apparatus as claimed in claim 1, wherein the bottom electrode comprises Ag, Al, Au, Cu, Fe, Ni, Mo, Pt, W, Co, Ru, Pd, Ti, TiN, TaN, W, Zr, a combination thereof, or an alloy or any of these materials with any other electrically conductive materials.

10. The apparatus as claimed in claim 9, wherein the bottom electrode comprises a non-reactive material that is selected from: Pt, Pd, Ir, Rh, Ru, TiN, TaN, a combination thereof, or an alloy or any of these materials with any other electrically conductive materials.

11. The apparatus as claimed in claim 1, wherein the top electrode comprises Ag, Al, Au, Cu, Fe, Ni, Mo, Pt, Pd, Ti, TiN, TaN, W, Zr, a combination thereof, or an alloy or any of these materials with any other electrically conductive materials.

12. The apparatus as claimed in claim 11, wherein the top electrode comprises a reactive material that is selected from Ta, Hf, Zr, Ti, Al, Fe, a combination thereof, or an alloy or any of these materials with any other electrically conductive materials, and wherein a switching filament is configured to be formed within the switching oxide stack from the top electrode.

13. The apparatus as claimed in claim 1, further comprises: a column wire connected to the bottom electrode; and a row wire connected to the top electrode.

14. The apparatus of claim 1, wherein the discontinuous oxide islands comprise a material that is more stable than the one or more base oxides.

15. The apparatus of claim 1, wherein each of the plurality of base oxide layers is thicker than any of the plurality of discontinuous oxide layers.

16. The apparatus of claim 1, wherein the plurality of discontinuous oxide layers comprises pinholes formed at random locations within the base oxides of the plurality of base oxide layers.

* * * * *